(12) United States Patent
Hannan et al.

(10) Patent No.: US 6,876,215 B1
(45) Date of Patent: Apr. 5, 2005

(54) APPARATUS FOR TESTING SEMICONDUCTOR INTEGRATED CIRCUIT DEVICES IN WAFER FORM

(75) Inventors: James M. Hannan, Portland, OR (US); John J. Harsany, Aloha, OR (US); James R. Jordan, St. Helens, OR (US); Phillip W. Sheeley, Hillsboro, OR (US)

(73) Assignee: Credence Systems Corporation, Milpitas, CA (US)

( * ) Notice: Subject to any disclaimer, the term of this patent is extended or adjusted under 35 U.S.C. 154(b) by 0 days.

(21) Appl. No.: 10/376,951

(22) Filed: Feb. 27, 2003

(51) Int. Cl.[7] .............................................. G01R 31/02
(52) U.S. Cl. .................................... 324/758; 324/158.1
(58) Field of Search ................................ 324/758, 754, 324/765, 158.1, 72.5, 763, 762; 724/761, 755; 438/14, 17, 18; 29/882; 714/724, 719

(56) References Cited

U.S. PATENT DOCUMENTS 5,274,575 A * 12/1993 Abe ........................... 356/400
5,528,158 A * 6/1996 Sinsheimer et al. ........ 324/758
5,594,357 A * 1/1997 Nakajima .................... 324/758
5,754,057 A * 5/1998 Hama et al. ................. 324/754
5,798,651 A * 8/1998 Aruga et al. ................. 324/754
5,804,983 A * 9/1998 Nakajima et al. ............ 324/758

* cited by examiner

Primary Examiner—Evan Pert
Assistant Examiner—Jimmy Nguyen
(74) Attorney, Agent, or Firm—John Smith-Hill; Smith-Hill and Bedell

(57) ABSTRACT

Apparatus for testing semiconductor integrated circuit devices in wafer form includes a test head, a probe card support mechanism attached to the test head for supporting a probe card beneath the test head, a wafer prober for presenting successive wafers to be tested to the test head from beneath the test head, and a lifting mechanism attached to the wafer prober for lifting the test head above the wafer prober. Upon lifting the test head above the wafer prober, the probe card support mechanism can move horizontally relative to the test head between an inserted position in which the probe card support mechanism is positioned to enable the probe card to engage contact elements of the test head and an extended position in which the probe card can be removed from the probe card support mechanism.

13 Claims, 4 Drawing Sheets

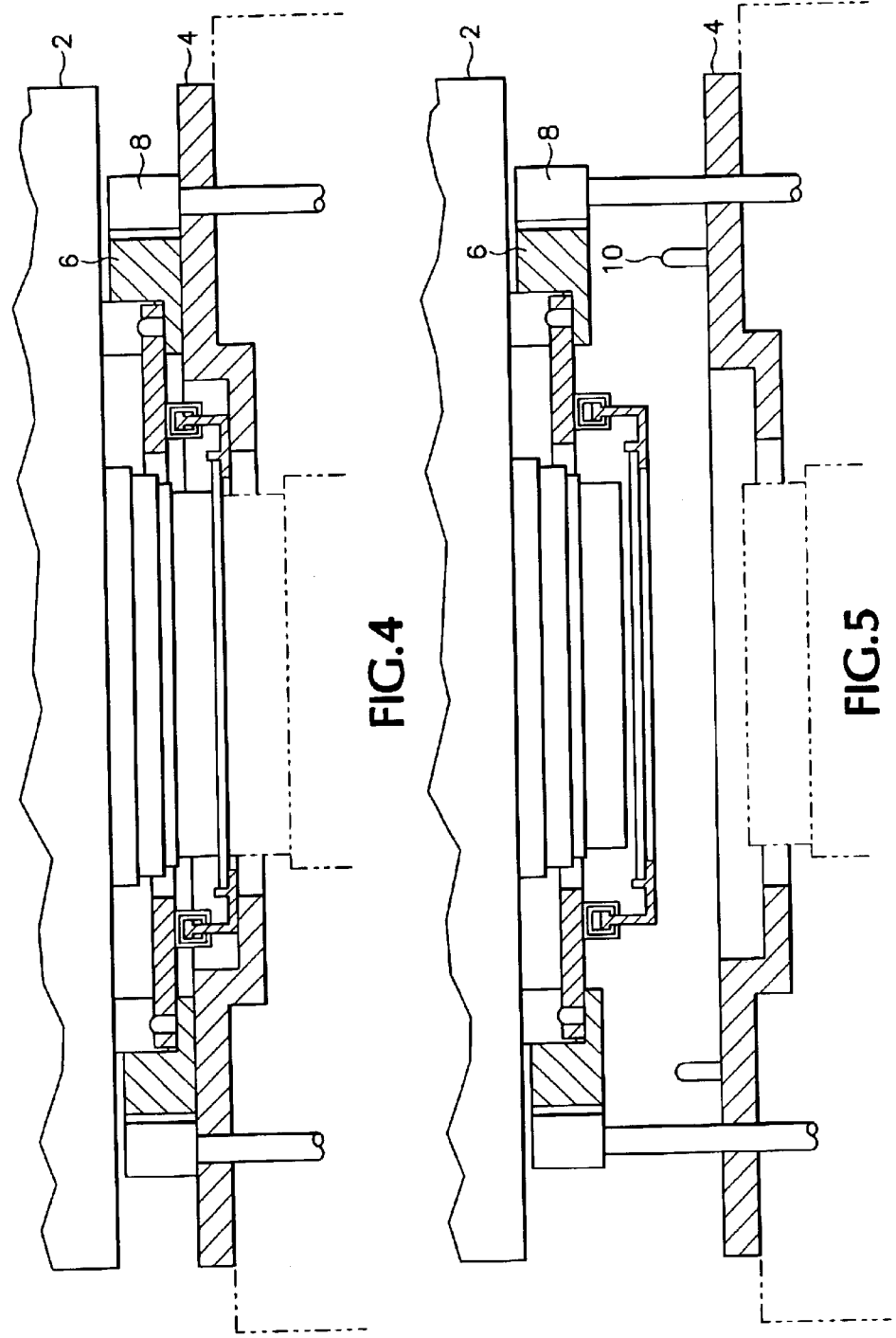

APPARATUS FOR TESTING SEMICONDUCTOR INTEGRATED CIRCUIT DEVICES IN WAFER FORM

BACKGROUND OF THE INVENTION

Semiconductor integrated circuit devices are typically tested both when the devices have been finished but exist in the form of a wafer and after final packaging when the devices are in the form in which they would be sold by the manufacturer. The first test is often referred to as wafer sort test and the second test is usually referred to as final test. The present invention is concerned with wafer sort testing.

The main items of equipment that are used in wafer sort testing are a semiconductor integrated circuit tester and a wafer prober. The tester includes a test head. The wafer prober presents a wafer incorporating devices to be tested to the test head and the tester tests the devices. Typically, the test head is positioned over the wafer prober using a test head manipulator so that alignment pins attached to the test head enter alignment bores formed in docking bars that are rigidly attached to the top plate of the wafer prober and the test head is docked to the wafer prober by engaging movable cams attached to the test head with follower bearings that are attached to the docking bars and displacing the cams to draw the test head towards the wafer prober. When the test head is docked to the wafer prober, a tester interface can deliver stimulus signals generated by the pin electronics to the device under test (DUT) and response signals produced by the DUT to the pin electronics.

A typical tester interface includes a probe interface board, a pogo tower and a probe card. The pogo tower comprises an array of double-ended spring probe pins, such as the pins that are commonly referred to as pogo pins, installed in a generally annular pogo tower body. The probe interface board is a circuit board having an array of contacts at its upper side for connection to suitable contacts of the pin electronics and having an array of contacts at its lower side for engaging individual pogo pins of the pogo tower. The probe card has an array of contacts at its upper side for engaging individual pogo pins and has probe tips at its lower side for engaging contact pads of the DUT. The probe interface board is clamped between the pogo tower and the test head whereas the probe card rests on the top plate of the wafer prober and is held between the pogo tower and the prober top plate when the test head is docked to the wafer prober.

Probe cards are device specific and therefore must be changed when the tester is used to test a different device. Further, testing causes wear and tear of a probe card and accordingly the probe card must be removed for repair and maintenance even if the tester continues to be used for testing the same device. Conventionally, the probe card is removed either by an automated mechanism built in to the wafer prober or by raising the test head so that the pogo tower does not interfere with access to the probe card and then removing the probe card from above the wafer prober.

SUMMARY OF THE INVENTION

In accordance with a first aspect of the invention there is provided apparatus for testing semiconductor integrated circuit devices in wafer form, the apparatus comprising a test head, a wafer prober for presenting successive wafers to he tested to the test head from beneath the test head, a probe card support mechanism attached to the wafer prober for supporting a probe card beneath the test head, and a lifting mechanism attached to the wafer prober for lifting the test head above the wafer prober, and wherein upon lifting the test head above the wafer prober, the probe card support mechanism can move horizontally relative to the test head between an inserted position in which the probe card support mechanism is positioned to enable the probe card to engage contact elements of the test head and an extended position in which the probe card can be removed from the probe card support mechanism.

In accordance with a second aspect of the invention there is provided a method of modifying an apparatus for testing semiconductor integrated circuit devices in wafer form, the apparatus comprising a test head and a wafer prober for presenting successive wafers to be tested to the test head from beneath the test head, said method comprising disengaging the test head from the wafer prober, attaching a litting mechanism to the wafer prober, attaching a probe card support mechanism to the wafer prober for supporting a probe card, and engaging the test head with the lifting mechanism, whereby the lifting mechanism can be employed to lift the test head above the wafer prober and upon lifting the test head above the wafer prober, the probe card support mechanism can move horizontally relative to the test head between an inserted position in which the probe card support mechanism is positioned to enable the probe card to engage contact elements of the test head and an extended position in which the probe card can be removed from the probe card support mechanism.

BRIEF DESCRIPTION OF THE DRAWINGS

For a better understanding of the invention, and to show how the same may be carried into effect, reference will now be made, by way of example, to the accompanying drawings, in which FIG. 4 is a part sectional partial view of the test apparatus with the test head in its test position, and FIG. 5 is a similar view illustrating the test head in an elevated position relative to the wafer prober.

At least one embodiment of the invention is described in detail below with reference to the drawings. For the sake of clarity and definiteness, the detailed description may refer to specific values or ranges of values or to specific material, but it should be understood that unless the context indicates otherwise, the values or ranges or materials are given by way of example and it is not intended that these values, ranges or materials should limit the scope of the claims.

Figure 1:
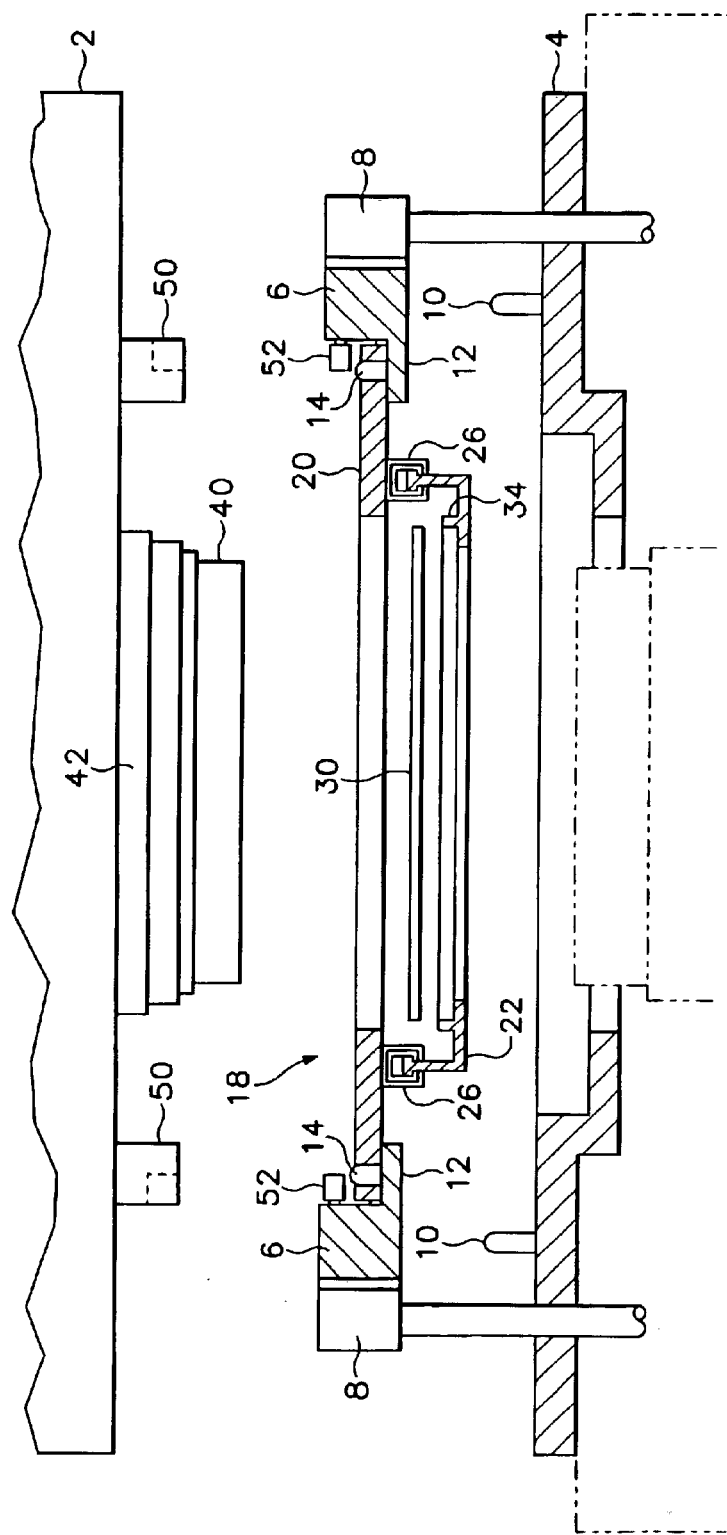
FIG. 1 is a partially exploded, part sectional view of test apparatus including a test head and a water prober.

Words of orientation that are used in the specification in connection with a structure or element are relative to the orientation of the structure or element when the test head is in the DUT down orientation as shown in FIG. 1 of the drawings. It will be appreciated, however, that this is merely for convenience in description and is not intended to limit the claims.

DETAILED DESCRIPTION

The components of the test apparatus are shown in simplified and schematic form in the drawings. The probe card and the pogo tower it particular are shown in simplified form, since, for example, the probe tips of the probe card and the spring probe pins of the pogo tower are not shown.

The test apparatus shown in FIGS. 1–5 comprises a test head 2 and a wafer prober having a wafer prober top plate 4. Coarse alignment pins (not shown) project upwardly from the wafer prober to engage alignment sockets (not shown) attached to the test head. Docking bars 6 are attached to the prober top plate 4 by a lifting mechanism 8. The lifting mechanism 8 may comprise, for example, a screw jack at each end of each docking bar. The lifting mechanism allows the docking bars 6 to be raised relative to the prober top plate from a test position (FIG. 4), in which the docking bars are in contact with the prober top plate, to a probe card change position (FIG. 5) and subsequently lowered relative to the prober top plate back to the test position. Alignment pins 10 attached to the prober top plate engage bores in the docking bars for positioning the docking bars horizontally relative to the prober top plate when the docking bars are lowered to the test position. Each docking bar 6 is provided with a flange 12 that extends towards the other docking bar and engagement pins 14 that extend upwards from each flange.

Figure 2:
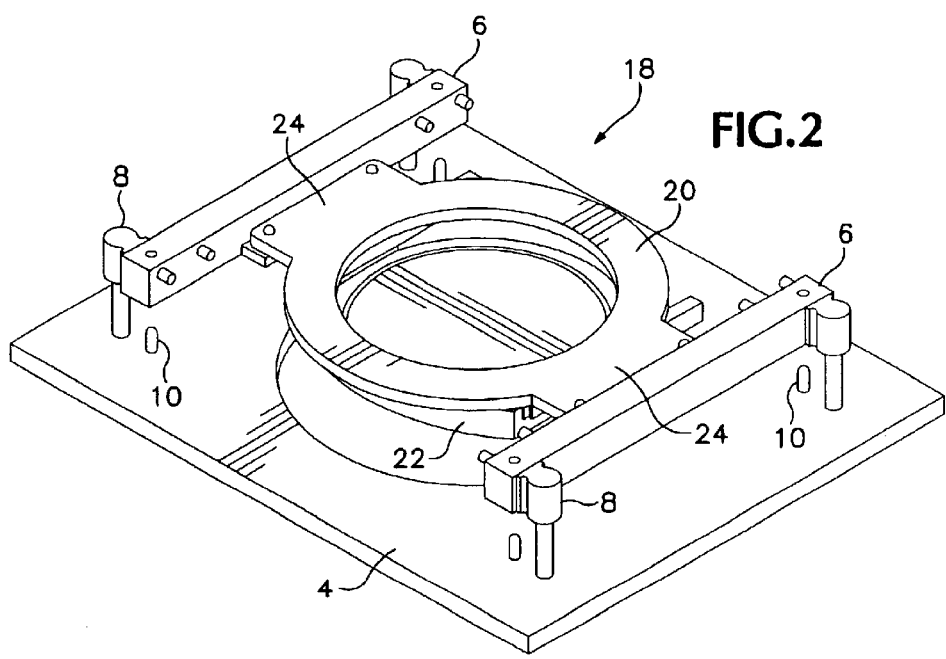
FIG. 2 is a partial perspective view of the apparatus when the docking bars are in an elevated position relative to the wafer prober top plate.
Figure 3:
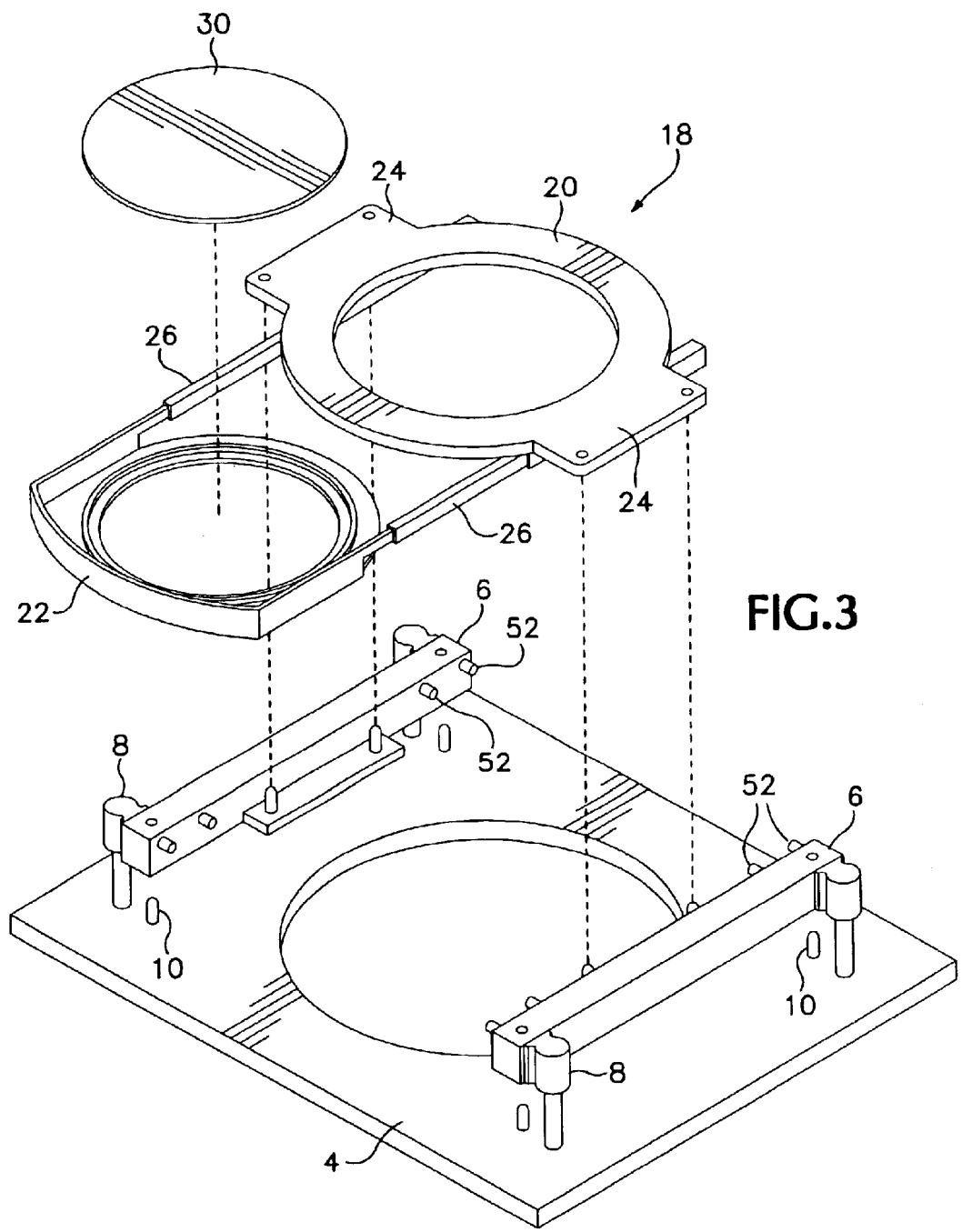
FIG. 3 is a partially exploded perspective view of the apparatus when in a probe card change condition.

A probe card changer 18 is attached to the docking bars 6 so that the probe card changer is raised and lowered relative to the prober top plate when the docking bars are raised and lowered. The probe card changer 18 includes a probe card changer body 20 and a probe card tray 22. The probe card tray is attached to the probe card changer body 20 by retractable slides 26 that allow the probe card tray to move relative to the probe card changer body 20 between a test position, Which is shown in FIG. 2 and in which the probe card tray 22 is directly beneath the probe card changer body 20, and a probe card change position, which is shown in FIG. 3 and in which the probe card can be removed from the probe card tray 22. The probe card changer body 20 is generally annular and has ears 24 that extend over the flanges 12 of the docking bars and are formed with bores for receiving the engagement pins 14. In this manner, the probe card changer body is uniquely positioned relative to the docking bars. A probe card 30 is located in the probe card tray 22. The probe card is coarsely positioned relative to the probe card tray 22 by an annular rim 34.

Referring to FIGS. 1–3, each slide 26 includes an outer guide attached to the probe card changer body 20, an intermediate guide fitted within the outer guide and moveable linearly therewithin, and an inner rail fitted within the intermediate guide and moveable linearly therewithin. The inner rail is T-shaped in section and play between the T-shaped rail and the intermediate guide allows a limited range of vertical movement of the inner rail relative to the intermediate guide.

A pogo tower 40 is attached to the test head 2 and a probe interface board 42 is clamped between the pogo tower 40 and the test head 2, as is conventional. The pogo tower, the probe interface board and the test head include alignment features for positioning the probe interface board relative to the test head and for positioning the pogo tower relative to the probe interface board. The probe card 30 is formed with alignment bores (not shown) for engaging alignment pins (not shown) that project downwards from the pogo tower for accurately positioning the probe card relative to the pogo tower when the probe card tray is in the test position.

The test head 2 includes movable cams 50 for engaging follower bearings 52 that are attached to the docking bars and thereby securing the test head to the docking bars.

When the test head is to be docked to the wafer prober, the docking bars are lowered to the test position (FIG. 4) and the test head is positioned over the prober top plate. The test head is positioned so that the coarse alignment pins attached to the prober top plate engage the alignment sockets attached to the test head. In this position, the pogo tower is aligned with a central opening in the probe card changer body 20. The test head is lowered and the follower bearings 52 enter cam slots in the cams 50. The cams are displaced parallel to the docking bars to draw the test head into docking relationship with the wafer prober. Testing then proceeds in the usual way. It will be observed from FIG. 4 that downward movement of the probe card tray 22 is limited by an annular stop 54 that projects from the wafer prober top plate 4.

When the probe card is to be changed, the lifting mechanism 8 is actuated and the docking bars 6 are elevated. The test head 2, being secured to the docking bars, also is elevated to its probe card change position. Referring to FIGS. 4 and 5, as the test head is lifted, the play between the T-shaped rail and the intermediate guide of the slide mechanism 26 allows the pogo tower to move upwards relative to the probe card tray 22 so that the pogo tower moves out of contact with the probe card. The probe card tray 22 can then be moved from its test position to its probe card change position (FIG. 3) and the current probe card can be removed and replaced with a different probe card. The rim 34 of the probe card tray positions the probe card coarsely relative to the probe card tray when the probe card is placed in the tray. The probe card tray 22 can then be returned to its test position and the test head can be lowered to its test position (FIG. 4). As the test head approaches its test position, the probe card tray 22 engages the stop 54, which prevents further downward movement of the probe card tray and the probe card resting thereon. As the test head continues to move downwards, the probe card changer body approaches the probe card tray. The probe card tray may be provided with alignment features for engaging corresponding features of the probe card changer body and positioning the probe card tray horizontally relative to the probe card changer body. When the test head approaches the end of its downward movement, the alignment pins of the pogo tower engage the bores in the probe card for fine positioning of the probe card relative to the pogo tower. In this manner, the new probe card is precisely positioned with respect to the pogo tower. Further, the spring probe pins of the pogo tower are compressed. Testing with the new probe card may then commence.

In the case of the embodiment described with reference to FIGS. 1–5, the downward movement of the test head forces the probe card tray upwards relative to the pogo tower to clamp the probe card against the pogo tower as the test head attains its test position. In another embodiment of the invention, the probe card tray may be forced upwards to clamp the probe card against the pogo tower before lowering the test head. In this case, a latch mechanism is provided for latching the probe card tray to the probe card changer body When the test head has been raised to the position shown in FIG. 5, the latch mechanism can be released to allow the probe card tray to move downwards relative to the probe card changer body and the tray can then be moved to the probe card change position. When the probe card has been changed and the probe card tray has been returned to its test position, the latch mechanism can be operated to lift the probe card tray relative to the probe card changer body.

The present invention provides a relatively simple and inexpensive retrofit for an existing tester to facilitate access to the probe card, for removal and replacement, without requiring an automatic mechanism built in to the wafer prober.

In another embodiment of the invention, the docking bars 6 and the probe card changer body 20 may be fabricated as a single piece, in which case the pins 14 may be omitted. Further, although the drawings illustrate use of linear cams 50 for securing the test head to the docking bars 6, any other suitable docking mechanism may be used instead.

It will be appreciated that the invention is not restricted to the particular embodiment that has been described, and that variations may be made therein without departing from the scope of the invention as defined in the appended claims and equivalents thereof. For example, it will be appreciated that generally where an alignment pin projects from a first element and engages an alignment socket attached to a second element, the reverse arrangement, in which the alignment pin projects from the second element and engages an alignment socket attached to the first element, is also feasible. Further, although the probe card changer body 20 is illustrated as being attached to the docking bars 6, to be raised and lowered as the test head is raised and lowered by the lifting mechanism 8, in another embodiment the probe card changer body maybe attached directly to the test head.

Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated.

What is claimed is:

1. Apparatus for testing semiconductor integrated circuit devices in wafer form, the apparatus comprising:
    a test head,
    a wafer prober for presenting successive wafers to be tested to the test head from beneath the test head,
    a probe card support mechanism attached to the wafer prober for supporting a probe card beneath the test head, and
    a lifting mechanism attached to the wafer prober for lifting the test head above the wafer prober,
    and wherein upon lifting the test head above the wafer prober, the probe card support mechanism can move horizontally relative to the test head between an inserted position in which the probe card support mechanism is positioned to enable the probe card to engage contact elements of the test head and an extended position in which the probe card can be removed from the probe card support mechanism.

2. Apparatus according to claim 1, further comprising a probe card changer body attached to the wafer prober and wherein the probe card support mechanism includes a probe card tray attached to the probe card changer body, the probe card tray being movable relative to the probe card changer body between a retracted position and a projecting position.

3. Apparatus according to claim 2, comprising attachment elements to which the probe card changer body is attached, the test head being releasably engageable to the attachment elements, and wherein the lifting mechanism is effective between the wafer prober and the attachment elements.

4. Apparatus according to claim 3, wherein the attachment elements are docking bars and the test head is releasably engageable to the docking bars by a cam mechanism.

5. Apparatus according to claim 2, wherein the probe card tray is moveable vertically relative to the probe card changer body when the test head is lifted above the wafer prober.

6. Apparatus according to claim 1, wherein the test head includes a pogo tower.

7. Apparatus according to claim 1, wherein the probe card support mechanism is attached to the lifting mechanism and the lifting mechanism is releasably attached to the test head.

8. A method of modifying an apparatus for testing semiconductor integrated circuit devices in wafer form, the apparatus comprising a test head and a wafer prober for presenting successive wafers to be tested to the test head from beneath the test head, said method comprising:
    disengaging the test head from the wafer prober,
    attaching a lifting mechanism to the wafer prober,
    attaching a probe card support mechanism to the wafer prober for supporting a probe card, and
    engaging the test head with the lifting mechanism,
    whereby the lifting mechanism can be employed to lift the test head above the wafer prober and upon lifting the test head above the wafer prober, the probe card support mechanism can move horizontally relative to the test head between an inserted position in which the probe card support mechanism is positioned to enable the probe card to engage contact elements of the test head and an extended position in which the probe card can be removed from the probe card support mechanism.

9. A method according to claim 8, wherein the apparatus includes attachment elements and the method comprises attaching the lifting mechanism to the attachment elements whereby the attachment elements may be elevated relative to the wafer prober.

10. A method according to claim 9, wherein the step of engaging the test head with the lifting mechanism comprises docking the test head to the attachment elements.

11. A method according to claim 8, wherein the apparatus includes docking bars and the method comprises attaching the lifting mechanism to the docking bars whereby the docking bars may be elevated relative to the wafer prober.

12. A method according to claim 8, comprising attaching the probe card support mechanism to the lifting mechanism and releasably attaching the lifting mechanism to the test head.

13. A method according to claim 8, wherein the method further comprises:
    moving the card support mechanism to the extended position,
    placing a probe card into the probe card support mechanism, and
    moving the probe card support mechanism to the inserted position.

* * * * *